US 12,211,735 B2

(12) United States Patent
Miura et al.

(10) Patent No.: US 12,211,735 B2
(45) Date of Patent: Jan. 28, 2025

(54) LOAD LOCK DEVICE

(71) Applicant: Canon Anelva Corporation, Kawasaki (JP)

(72) Inventors: Jun Miura, Hachioji (JP); Naoya Fukuda, Chofu (JP); Shinji Takagi, Tama (JP); Hidetoshi Shimokawa, Fuchu (JP)

(73) Assignee: Canon Anelva Corporation, Kawasaki (JP)

( * ) Notice: Subject to any disclaimer, the term of this patent is extended or adjusted under 35 U.S.C. 154(b) by 326 days.

(21) Appl. No.: 17/575,690

(22) Filed: Jan. 14, 2022

(65) Prior Publication Data

US 2022/0139761 A1    May 5, 2022

Related U.S. Application Data

(63) Continuation of application No. PCT/JP2020/033161, filed on Sep. 2, 2020.

(30) Foreign Application Priority Data

Sep. 6, 2019 (WO) .................. PCT/JP2019/035248

(51) Int. Cl.
*H01L 21/687* (2006.01)
*H01L 21/67* (2006.01)
*H01L 21/677* (2006.01)

(52) U.S. Cl.
CPC .. *H01L 21/68785* (2013.01); *H01L 21/67017* (2013.01); *H01L 21/677* (2013.01)

(58) Field of Classification Search
CPC ........... H01L 21/68778; H01L 21/6875; H01L 21/68735; H01L 21/67201;

(Continued)

(56) References Cited

U.S. PATENT DOCUMENTS

| 5,223,001 A | 6/1993 | Saeki |
| 9,870,964 B1 | 1/2018 | Yoshino et al. |

(Continued)

FOREIGN PATENT DOCUMENTS

| JP | H05140743 A | 6/1993 |
| JP | 2001070782 A | 3/2001 |

(Continued)

OTHER PUBLICATIONS

International Search Report (PCT/ISA/210) with translation and Written Opinion (PCT/ISA/237) mailed on Oct. 27, 2020, by the Japanese Patent Office as the International Searching Authority for International Application No. PCT/JP2020/033161. (11 pages).

(Continued)

*Primary Examiner* — Glenn F Myers
(74) *Attorney, Agent, or Firm* — Buchanan Ingersoll & Rooney PC

(57) ABSTRACT

A load lock device includes a load lock chamber, and a substrate holding structure configured to hold a substrate in the load lock chamber, wherein the substrate holding structure includes a facing surface facing the substrate, and is configured to allow a gas to flow through a space between the substrate and the facing surface, and in a state in which the substrate is held by the substrate holding structure, a distance between the substrate and a portion located inside an outer edge of the facing surface is larger than a distance between the substrate and the outer edge of the facing surface.

21 Claims, 13 Drawing Sheets

(58) Field of Classification Search
CPC ......... H01L 21/67748; H01L 21/68742; H01L 21/677; H01L 21/67017; H01L 21/68785
See application file for complete search history.

(56) References Cited

U.S. PATENT DOCUMENTS

| | | | | |
|---|---|---|---|---|
| 2009/0245761 | A1* | 10/2009 | Nakajima | F27B 17/0025 |
| | | | | 392/416 |
| 2010/0270004 | A1 | 10/2010 | Landess et al. | |
| 2011/0318142 | A1 | 12/2011 | Gage et al. | |
| 2016/0215393 | A1* | 7/2016 | Ramanathan | C23C 16/4583 |
| 2016/0300753 | A1* | 10/2016 | Hieda | H01L 21/68764 |
| 2017/0032510 | A1* | 2/2017 | Francken | G06T 7/0004 |
| 2018/0329237 | A1* | 11/2018 | Xiong | G02F 1/1368 |

FOREIGN PATENT DOCUMENTS

| | | |
|---|---|---|
| JP | 2004349332 A | 12/2004 |
| JP | 2006093543 A | 4/2006 |
| JP | 2010165841 A | 7/2010 |
| JP | 5462946 B2 | 4/2014 |
| KR | 10-2018-0051911 A | 5/2018 |
| TW | 201814804 A | 4/2018 |
| WO | 2012/002499 A1 | 1/2012 |
| WO | 2012077547 A1 | 6/2012 |
| WO | 2017066418 A1 | 4/2017 |

OTHER PUBLICATIONS

Taiwan Office Action with translation issued in corresponding Taiwan Patent Application No. 109130338 dated Dec. 23, 2021. (6 pages).

Extended European Search Report dated Sep. 6, 2023, issued by the European Patent Office in corresponding European Application No. 20861168.1-1211, (8 pages).

Office Action (Written Decision on Registration) issued on Jun. 19, 2024, by the Korean Patent Office in corresponding Korean Patent Application No. 10-2022-7003149. (5 pages).

* cited by examiner

LOAD LOCK DEVICE

CROSS-REFERENCE TO RELATED APPLICATIONS

This application is a Continuation of International Patent Application No. PCT/JP2020/033161, filed Sep. 2, 2020, which claims the benefit of International Patent Application No. PCT/JP2019/035248, filed Sep. 6, 2019, both of which are hereby incorporated by reference herein in their entirety.

BACKGROUND OF THE INVENTION

Field of the Invention

The present invention relates to a load lock device.

Background Art

Japanese Patent Laid-Open No. 5-140743 discloses a vacuum processing device including a load lock chamber, a wafer stage arranged in the load lock chamber, and a mechanism configured to move the wafer stage up and down. The wafer stage has a convex shape.

In a substrate holding structure having a structure like the wafer stage described in Japanese Patent Laid-Open No. 5-140743, the wafer stage may generate a standing vortex when forming a gas flow in the load lock chamber. Such a standing vortex may, for example, blow up particles from the lower side of a substrate to above the substrate and adhere the particles to the substrate.

SUMMARY OF INVENTION

The present invention provides a technique advantageous in preventing particles from adhering to a substrate.

According to one aspect of the present invention, in a load lock device comprising a load lock chamber, and a substrate holding structure configured to hold a substrate in the load lock chamber, the substrate holding structure includes a facing surface facing the substrate, and is configured to allow a gas to flow through a space between the substrate and the facing surface, and in a state in which the substrate is held by the substrate holding structure, a distance between the substrate and a portion located inside an outer edge of the facing surface is larger than a distance between the substrate and the outer edge of the facing surface.

Further features of the present invention will become apparent from the following description of exemplary embodiments with reference to the attached drawings.

DESCRIPTION OF THE EMBODIMENTS

Figure 1:
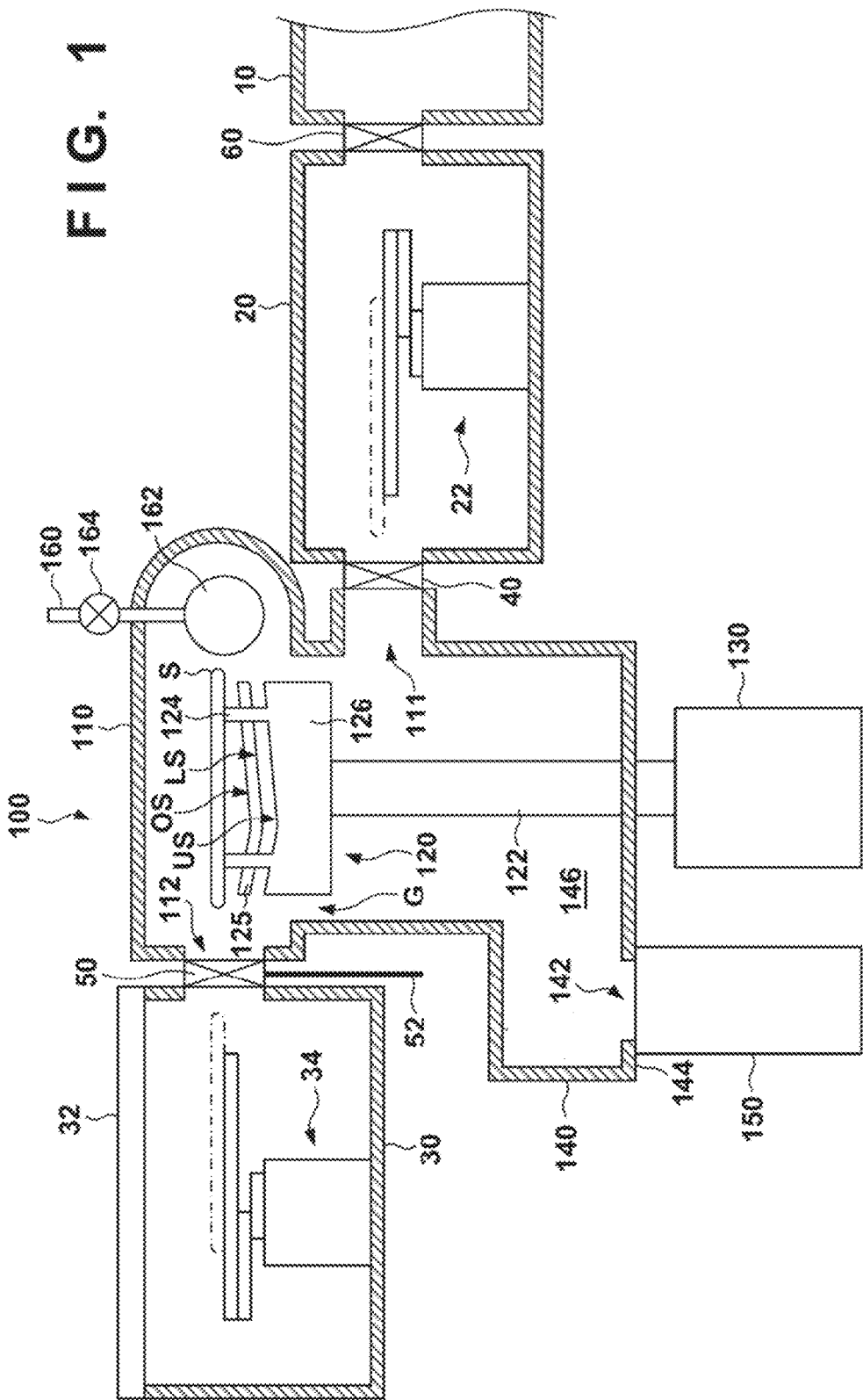
FIG. 1 is a view schematically showing the configuration of a processing device including a load lock device according to the first embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 schematically shows the configuration of a processing device including a load lock device 100 according to the first embodiment of the present invention. The load lock device 100 can include a load lock chamber 110 arranged between a loader chamber 30 and a transfer chamber 20. The loader chamber 30 can be maintained in an atmospheric environment. In the loader chamber 30, for example, a substrate S can be provided from a carrier. Alternatively, the substrate S can be provided from a pre-processing device to the loader chamber 30. The loader chamber 30 can include a filter 32 on the ceiling, and a downflow can be supplied to the internal space of the loader chamber 30 via the filter 32. A conveyance robot 34 is arranged in the loader chamber 30, and the substrate S can be conveyed by the conveyance robot 34. The conveyance robot 34 can convey the substrate S from the loader chamber 30 to the load lock chamber 110 via a valve 50. The pressure in the load lock chamber 110 to which the substrate S is conveyed is sufficiently reduced. After that, a conveyance robot 22 arranged in the transfer chamber 20 can convey the substrate S from the load lock chamber 110 to the transfer chamber 20 via a valve 40. After that, the conveyance robot 22 can convey the substrate S from the transfer chamber 20 to a reduced-pressure processing device 10 via a valve 60. The reduced-pressure processing device 10 can be one of, for example, a CVD device, a PVD device, an etching device, a plasma processing device, and an electron-beam exposure device.

The load lock chamber 110 can include a first conveyance port 111 connected to the transfer chamber 20 connected to the reduced-pressure processing device 10, and a second conveyance port 112 connected to the loader chamber 30. In an example, the height of the first conveyance port 111 (for example, the height of the lower end of the first conveyance port 111) is lower than the height of the second conveyance port 112 (for example, the height of the lower end of the second conveyance port 112). The first conveyance port 111 can be arranged to communicate with the internal space of the transfer chamber 20 via the valve 40. The second conveyance port 112 can be arranged to communicate with the internal space of the loader chamber 30 via the valve 50.

The load lock device 100 can include a gas introducing portion 160 that introduces a gas (for example, clean dry air or nitrogen gas) into the load lock chamber 110. The gas introducing portion 160 can be arranged above a path between a substrate holding structure 120 and the transfer chamber 20 in a state in which, for example, the substrate S is conveyed to the transfer chamber 20 via the first conveyance port 111. In an example, the gas introducing portion 160 can be arranged above the first conveyance port 111. The gas introducing portion 160 can include a gas dispersing portion 162 that disperses the gas to the internal space of the load lock chamber 110. At least a part of the gas dispersing portion 162 can be arranged in the load lock chamber 110. The gas dispersing portion 162 can be arranged at a position facing the second conveyance port 112. The gas introducing portion 160 can include a flow adjusting valve 164 that adjusts the gas introduction. The gas dispersing portion 162 can have a pillar-shaped portion. The inner side surface of the load lock chamber 110 can be apart from the pillar-shaped portion, and can include a curved surface along the pillar-shaped portion. The pillar-shaped portion can have a columnar shape, and the curved surface can form a part of a cylindrical surface.

The load lock device 100 can have the substrate holding structure 120 that holds the substrate S in the load lock chamber 110. The substrate holding structure 120 can include a facing surface OS facing the substrate S, and can be configured to allow a gas to flow through a space between the substrate S and the facing surface OS. As shown in the enlarged view of FIG. 10, the substrate holding structure 120 can have a structure in which the distance between the substrate S and a portion PP located inside an outer edge EE of the facing surface OS is larger than the distance between the substrate S and the outer edge EE of the facing surface OS in a state in which the substrate S is held by the substrate holding structure 120. It was confirmed by simulations that such a structure can effectively suppress formation of a standing vortex in a gas flow in the internal space of the load lock chamber 110, as schematically indicated by dotted arrows in FIG. 10. Here, the gas flow can be formed by introducing the gas to the internal space of the load lock chamber 110 by the gas introducing portion 160 and/or discharging the gas from the internal space by the pump 150 or the like as will be described later. Hence, the gas flow can necessarily be formed in the load lock chamber 110 in which the pressure changes in a wide range from the atmospheric pressure to a high vacuum.

Figure 11:
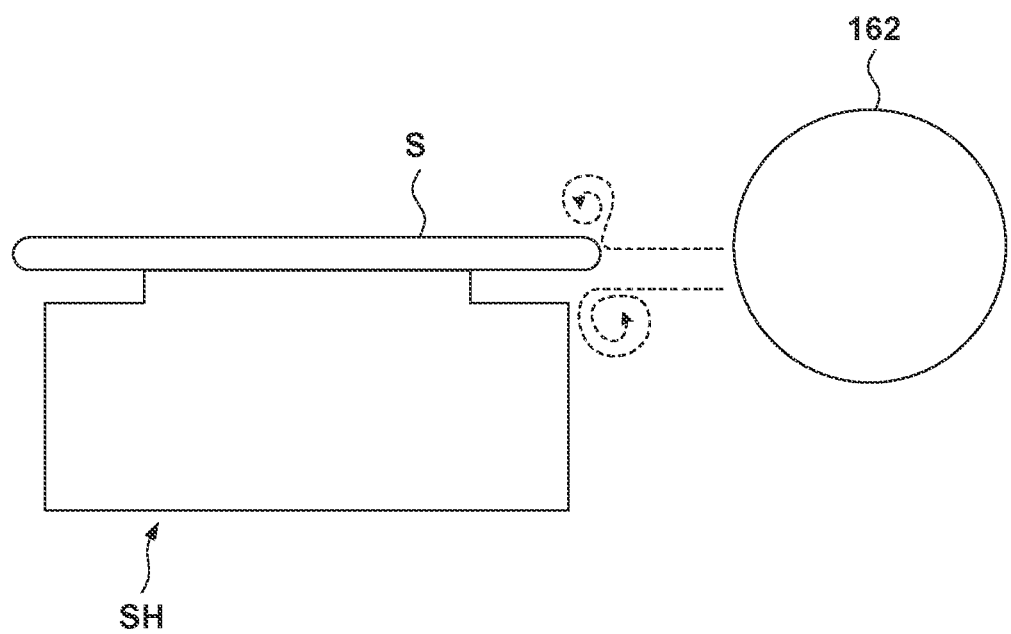
FIG. 11 is a view for explaining a problem.
Figure 12:
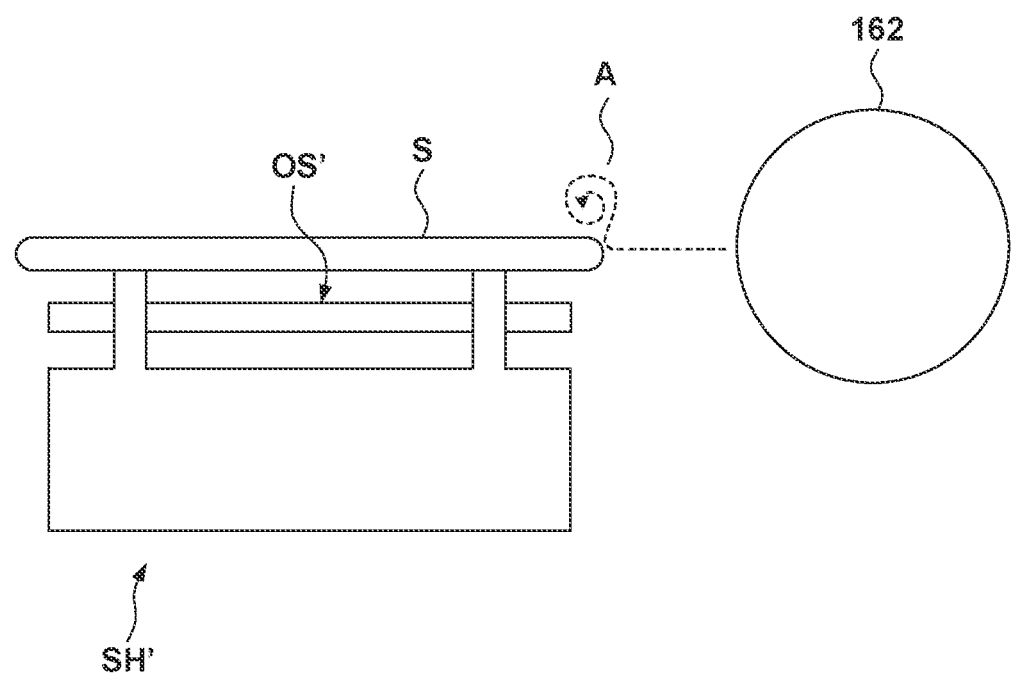
FIG. 12 is a view for explaining a problem.

On the other hand, as schematically indicated by dotted arrows in FIG. 11, if a substrate holding structure SH configured to hold the substrate S includes a wall that impedes the gas flow, a standing vortex A may be formed in the gas flow. Such a standing vortex A may blow up particles and adhere the particles to the substrate S. It was also confirmed by simulations that even if a substrate holding structure SH' configured to hold the substrate S includes a flat facing surface OS' parallel to the lower surface of the substrate S, a standing vortex A is formed in the gas flow, as schematically indicated by a dotted arrow in FIG. 12. Such a standing vortex may blow up particles and adhere the particles to the substrate S.

Referring back to FIG. 1, the substrate holding structure 120 can include a first member 125 with the facing surface OS, and a second member 126 with an upper surface US facing a lower surface LS of the first member 125. The substrate holding structure 120 can include a plurality of contact portions 124 that contact the substrate S so as to support the substrate S. The second member 126 can support the first member 125 and the plurality of contact portions 124. The upper surface US of the second member 126 can have a shape along the lower surface LS of the first member 125. Such a structure enables the smooth flow of the gas. With a structure in which the space defined by the first member 125 (lower surface LS) and the second member 126 (upper surface US), which face each other, does not exist as a channel for the gas, that is, with a structure in which the space is filled with a solid, the gas flow is impeded, and a standing vortex may be generated. On the other hand, a structure in which the first member 125 (lower surface LS) and the second member 126 (upper surface US) face each other is advantageous in suppressing generation of a standing vortex.

The load lock device 100 can include a driving mechanism 130. The driving mechanism 130 can be arranged on the lower side of the load lock chamber 110 to move the substrate holding structure 120 up and down. The driving mechanism 130 can be connected to the substrate holding structure 120 via a connecting member 122.

The load lock chamber 110 can include an extension chamber 140 extended from the lower portion of the load lock chamber 110 to a side, and a pump 150 arranged on the lower side of the extension chamber 140 and discharge a gas in the load lock chamber 110 via the extension chamber 140. The extension chamber 140 can include a bottom surface 144 with an opening 142 at a position deviated from the vertically lower position of the substrate holding structure 120. The pump 150 can be connected to the opening 142. Although not illustrated, a valve can be arranged between the pump 150 and the opening 142.

The pump 150 can include, for example, a rotary pump, and a turbomolecular pump arranged between the rotary pump and the opening 142. The turbine of the turbomolecular pump rotates at a high speed during the operation. If particles sucked by the turbomolecular pump collide against the turbine, these may be bounced by the turbine. In addition, the pump 150 itself may generate particles independently of whether the pump 150 is a turbomolecular pump or not. Hence, it is preferable that the pump 150 is connected to the opening 142 provided in the bottom surface 144 of the extension chamber 140 extended from the lower portion of the load lock chamber 110 to the side. This can reduce the particles from the pump 150 reaching the space above the substrate S via a gap G between the side surface of the substrate holding structure 120 and the inner side surface of the load lock chamber and adhering to the substrate S.

A gas discharge line 52 can be connected to the valve 50 arranged between the loader chamber 30 and the second conveyance port 112 of the load lock chamber 110. The gas in the space near the second conveyance port 112 can be discharged to the external space of the load lock chamber 110 via the gas discharge line 52. A pump (not shown) can be connected to the gas discharge line 52.

At least a part of the second conveyance port 112 can be arranged above (vertically above) the extension chamber 140. Alternatively, at least a part of the extension chamber 140 can be arranged between the second conveyance port 112 and the pump 150. This configuration is advantageous in reducing the foot print of the load lock device 100.

At least a part of the loader chamber 30 can be arranged above (vertically above) the extension chamber 140. Alternatively, at least a part of the extension chamber 140 can be arranged between the loader chamber 30 and the pump 150. This configuration is also advantageous in reducing the foot print of the load lock device 100.

Figure 15:
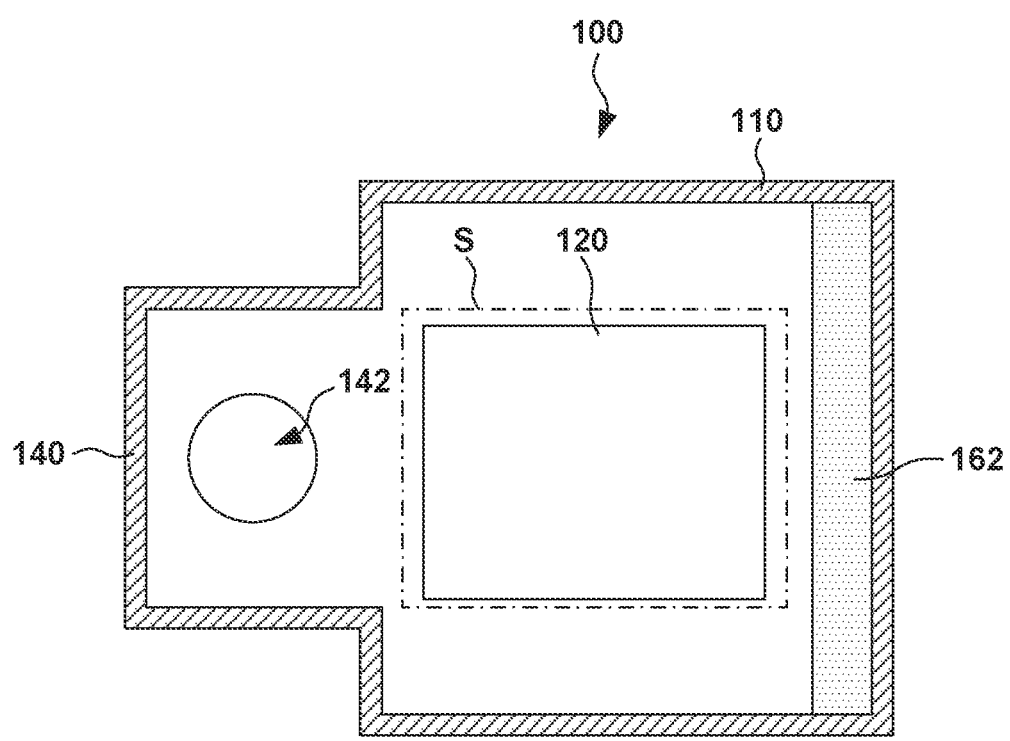
FIG. 15 is a plan view showing the arrangement of a load lock chamber, an extension chamber, and a gas dispersing portion.

FIG. 15 is a plan view showing the arrangement of the load lock chamber 110, the extension chamber 140, and the gas dispersing portion 162. This plan view can also be understood as an orthogonal projection to the floor on which the load lock device 100 is arranged. In the plan view or orthogonal projection, the substrate holder 120 can be located between the gas dispersing portion 162 and the extension chamber 140. Alternatively, in the plan view or orthogonal projection, the opening 142 can be located between the gas dispersing portion 162 and the extension chamber 140.

The area of the gap G between the side surface of the substrate holding structure 120 and the inner side surface of the load lock chamber 110 is preferably smaller than the sectional area of the second conveyance port 112. The area of the gap G is more preferably smaller than ½, ⅓, or ¼ of the sectional area of the second conveyance port 112. When the substrate S is conveyed from the loader chamber 30 to the internal space of the load lock chamber 110 via the second conveyance port 112, this configuration is advantageous in increasing the amount of the gas introduced from the gas dispersing portion 162 to the internal space of the load lock chamber 110 and discharged via the second conveyance port 112 and the gas discharge line 52 as compared to the amount of the gas discharged from the space above the substrate S to the space below the substrate holding structure 120 via the gap G. This is effective to suppress particles entering from the loader chamber 30 to the internal space of the load lock chamber 110 via the second conveyance port 112.

The area of the gap G between the side surface of the substrate holding structure 120 and the inner side surface of the load lock chamber 110 is preferably smaller than the sectional area of the opening 142 provided in the bottom surface 144 of the extension chamber 140. This configuration is advantageous in reducing the particles from the pump 150 reaching the space above the substrate S via the gap G and adhering to the substrate S. The area of the gap G is preferably smaller than the sectional area (the sectional area along a vertical plane) of a connection portion 146 between the load lock chamber 110 and the extension chamber 140. This configuration is also advantageous in reducing the particles from the pump 150 reaching the space above the substrate S via the gap G and adhering to the substrate S.

Figure 2:
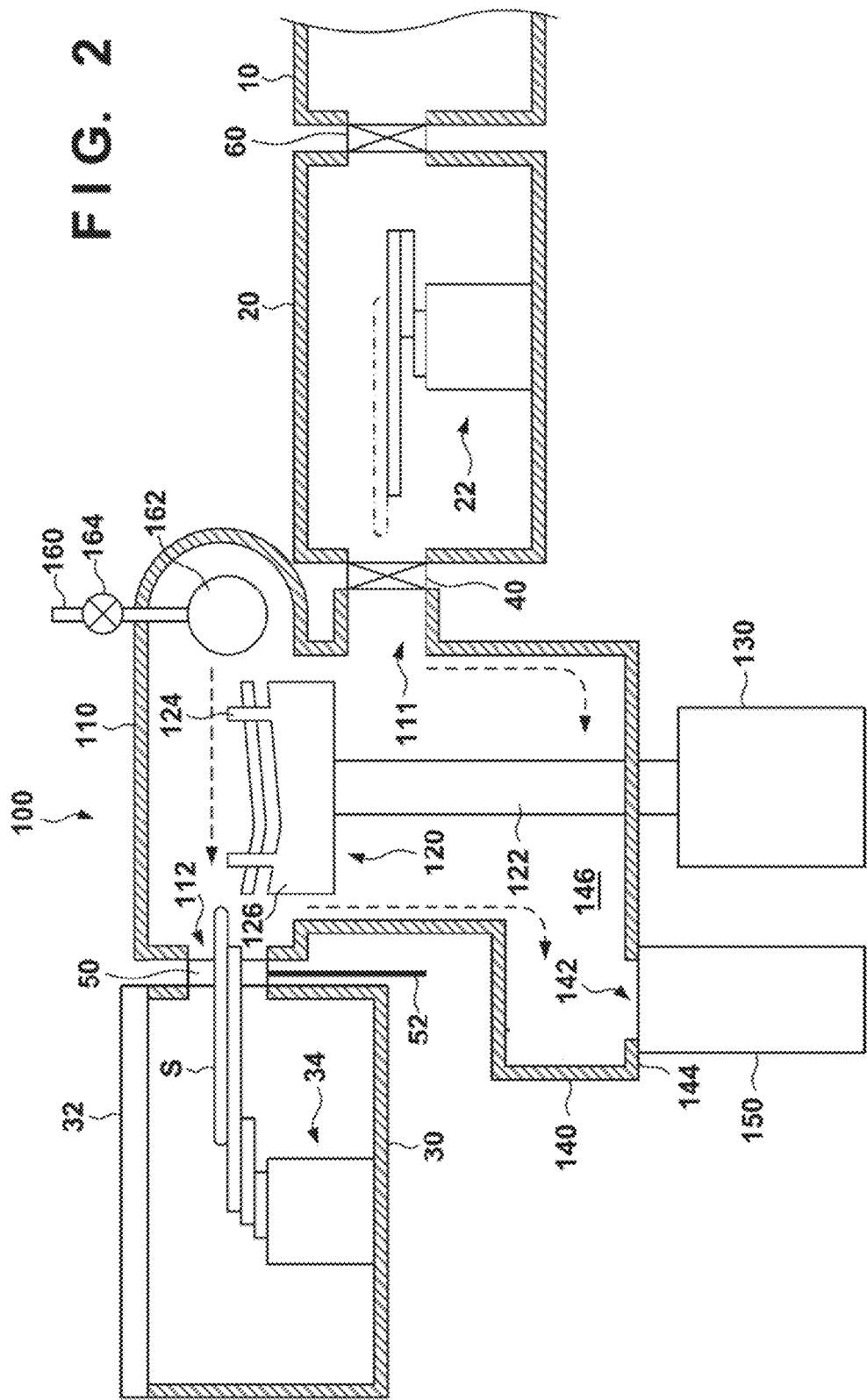
FIG. 2 is a view showing the operation of the processing device including the load lock device according to the first embodiment of the present invention.

FIGS. 2, 3, 4, and 5 exemplarily show the operation of the processing device shown in FIG. 1. First, while introducing (supplying) the gas from the gas introducing portion 160 to the internal space of the load lock chamber 110, the gas in the internal space can be discharged by the pump 150 to the external space of the load lock chamber 110. At this time, to raise the pressure in the internal space, the introduction amount of the gas from the gas introducing portion 160 to the internal space can be made larger than the gas discharge amount by the pump 150. When the pressure in the internal space becomes equal to or more than the atmospheric pressure, the valve 50 can be opened, as shown in FIG. 2, and the gas discharge via the gas discharge line 52 can be started. After that, the conveyance robot 34 can convey the substrate S from the loader chamber 30 to the substrate holding structure 120 in the internal space of the load lock chamber 110.

Figure 3:
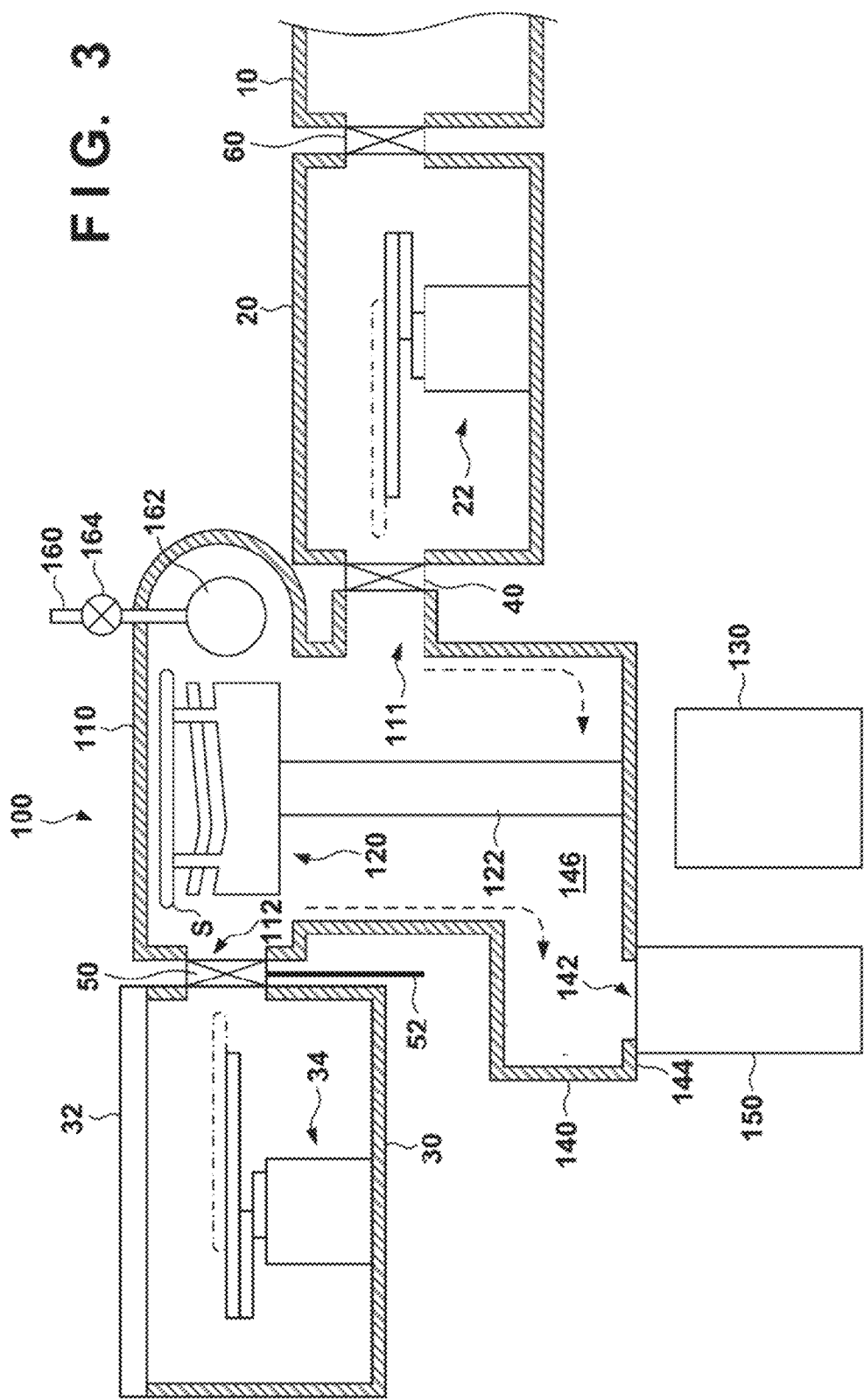
FIG. 3 is a view showing the operation of the processing device including the load lock device according to the first embodiment of the present invention.

After that, as shown in FIG. 3, the valve 50 can be closed, and the substrate holding structure 120 can be driven upward by the driving mechanism 130. Also, in a state in which the gas is introduced from the gas introducing portion 160 to the internal space of the load lock chamber 110, the gas discharge amount from the internal space by the pump 150 is increased, and the pressure in the internal space is reduced. After that, gas introduction to the internal space by the gas introducing portion 160 can be stopped, and the gas discharge amount from the internal space by the pump 150 can further be increased.

Figure 4:
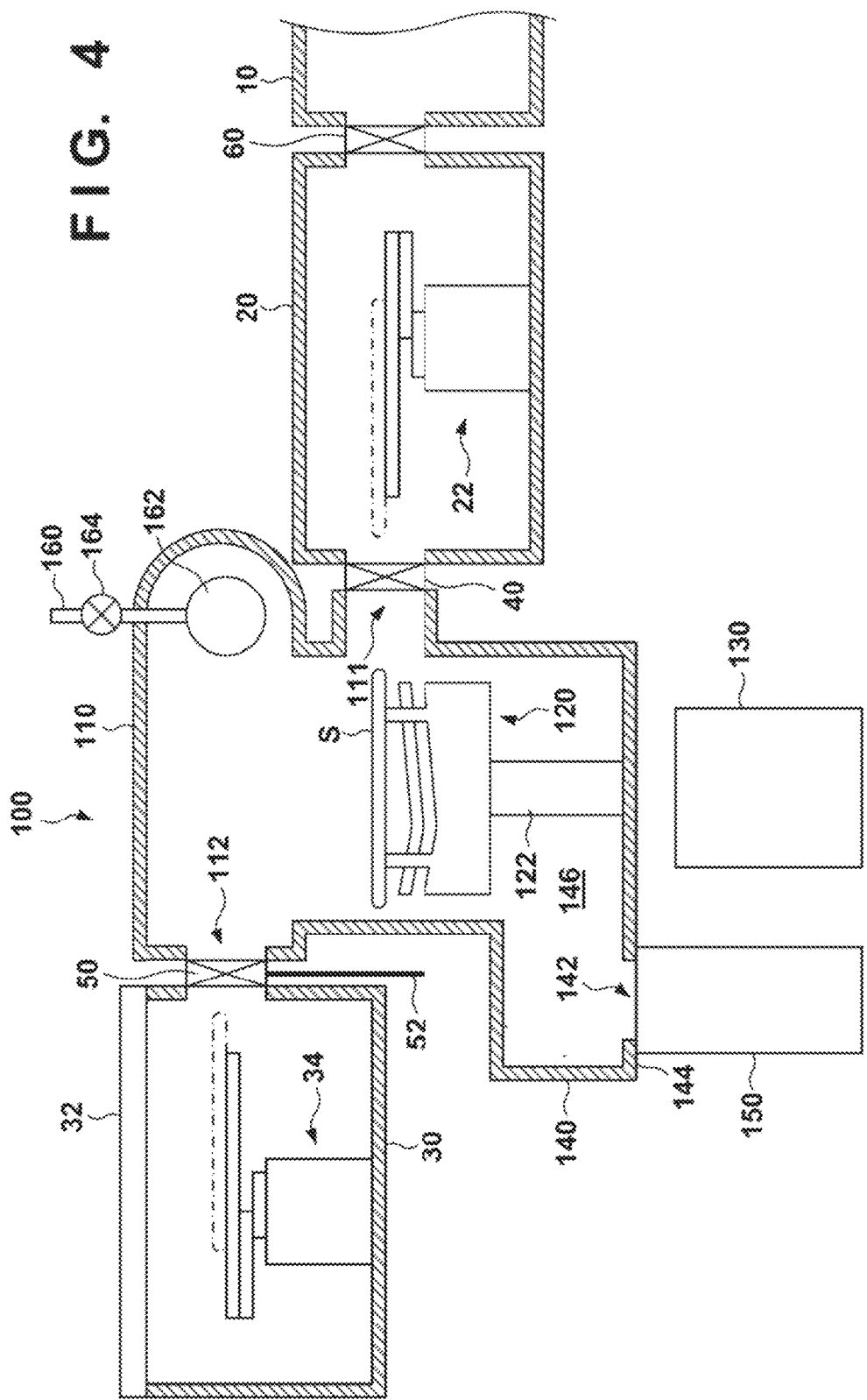
FIG. 4 is a view showing the operation of the processing device including the load lock device according to the first embodiment of the present invention.
Figure 5:
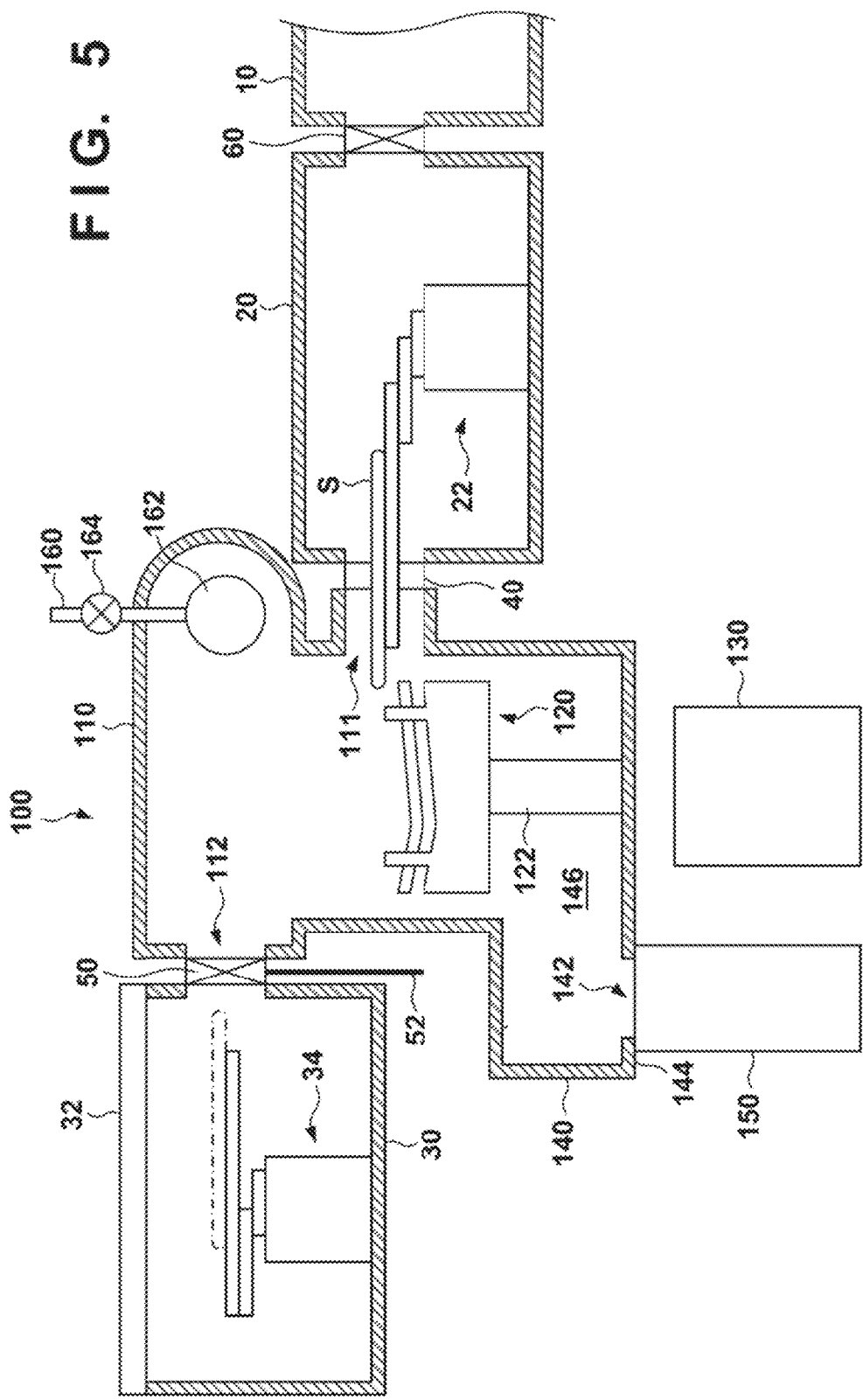
FIG. 5 is a view showing the operation of the processing device including the load lock device according to the first embodiment of the present invention.

When the pressure in the internal space of the load lock chamber 110 is sufficiently reduced, the substrate holding structure 120 can be driven downward by the driving mechanism 130 up to a height to convey the substrate S to the transfer chamber 20, as shown in FIG. 4. After that, as shown in FIG. 5, the valve 40 can be opened, and the conveyance robot 22 can convey the substrate S from the internal space of the load lock chamber 110 to the transfer chamber 20 and then to the reduced-pressure processing device 10. Then, the valve 40 is closed, and the substrate S is processed in the reduced-pressure processing device 10.

After that, the valve 40 can be opened, and the conveyance robot 22 can convey the substrate S in the reduced-pressure processing device 10 to the internal space of the load lock chamber 110, as shown in FIG. 5. After that, the valve 40 can be closed.

Then, while introducing the gas from the gas introducing portion 160 to the internal space of the load lock chamber 110, the gas in the internal space can be discharged by the pump 150 to the external space of the load lock chamber 110. At this time, to raise the pressure in the internal space, the introduction amount of the gas from the gas introducing portion 160 to the internal space can be made larger than the gas discharge amount by the pump 150. When the pressure in the internal space becomes equal to or more than the atmospheric pressure, the valve 50 can be opened, as shown in FIG. 2, and the gas discharge via the gas discharge line 52 can be started. After that, the conveyance robot 34 can convey the substrate S from the substrate holding structure 120 in the internal space of the load lock chamber 110 to the loader chamber 30. After that, the valve 50 can be closed, and the gas discharge via the gas discharge line 52 can be stopped.

As shown in FIGS. 1, 3, and 4, the substrate holding structure 120 can hold the substrate S such that at least a part of the side surface (outer peripheral surface) of the substrate S faces the inner surface of the load lock chamber 110. Here, the substrate holding structure 120 can hold the substrate S such that the at least part of the side surface (outer peripheral surface) of the substrate S held by the substrate holding structure 120 can face the inner surface of the load lock chamber 110 concerning a direction parallel to the surface of the substrate S.

As shown in FIGS. 1 to 5, the substrate holding structure 120 can be arranged at a plurality of positions in the internal space of the load lock chamber 110. The plurality of positions can include a position where a part of the side surface of the substrate S held by the substrate holding structure 120 faces the gas dispersing portion 162, as shown in FIG. 1. Here, the part of the side surface (outer peripheral surface) of the substrate S held by the substrate holding structure 120 can face the gas dispersing portion 162 concerning a direction parallel to the surface of the substrate S.

Figure 13A:
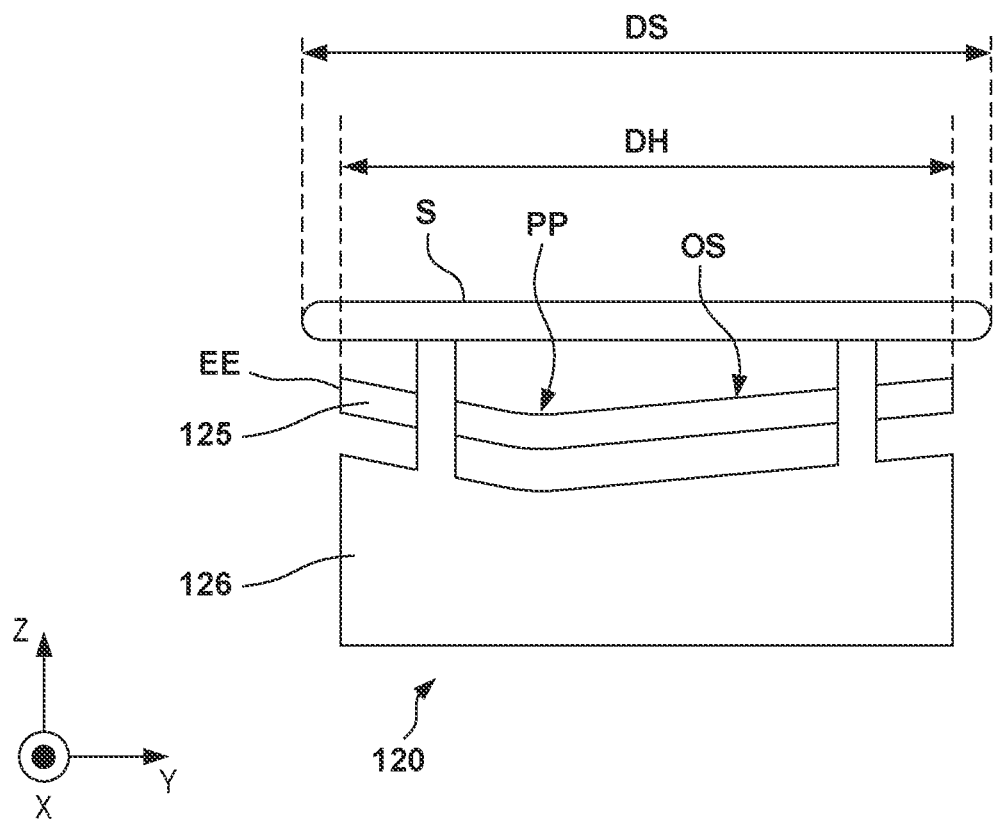
FIG. 13A is a view showing a substrate holding structure.
Figure 13B:
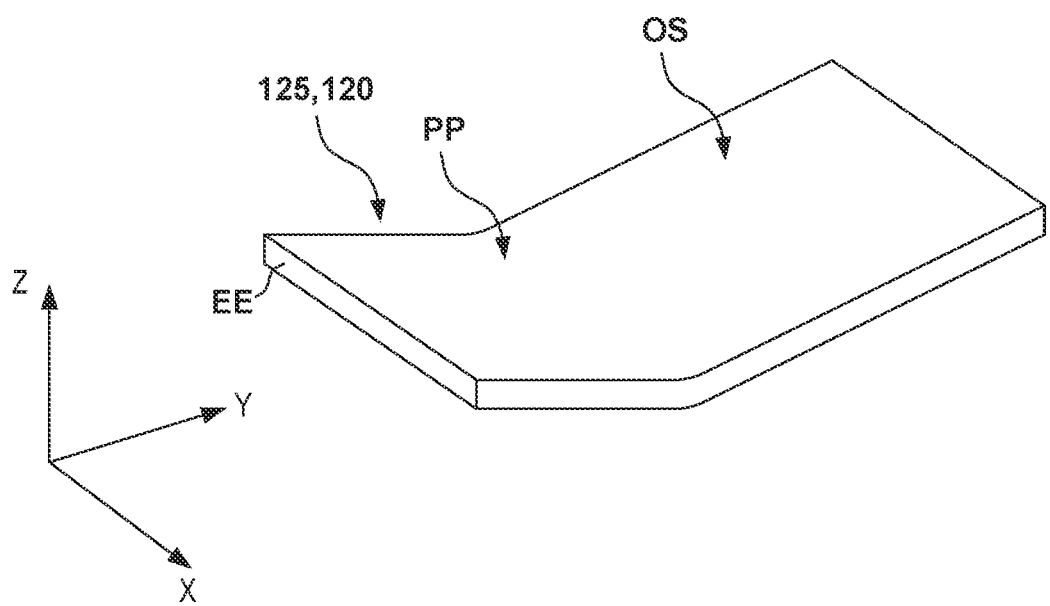
FIG. 13B is a view showing the shape of the first member or facing surface of the substrate holding structure shown in FIG. 13A.

As shown in FIG. 13A, the substrate holding structure 120 may be configured such that a size DH of the facing surface OS of the substrate holding structure 120 in a surface direction (a direction parallel to the X-Y plane) along the surface of the substrate S is smaller than a size DS of the substrate S in the surface direction. As shown in FIGS. 13A and 13B, the portion PP of the substrate holding structure 120 can be located inside the outer edge EE of the facing surface OS concerning a predetermined direction (Y direction) in a horizontal plane (X-Y plane). The cross sections of the facing surface OS cut along a plurality of planes (a plurality of planes parallel to the Y-Z plane) that are perpendicular to the horizontal plane (X-Y plane) and parallel to the predetermined direction (Y direction) can have shapes identical to each other.

Figure 14A:
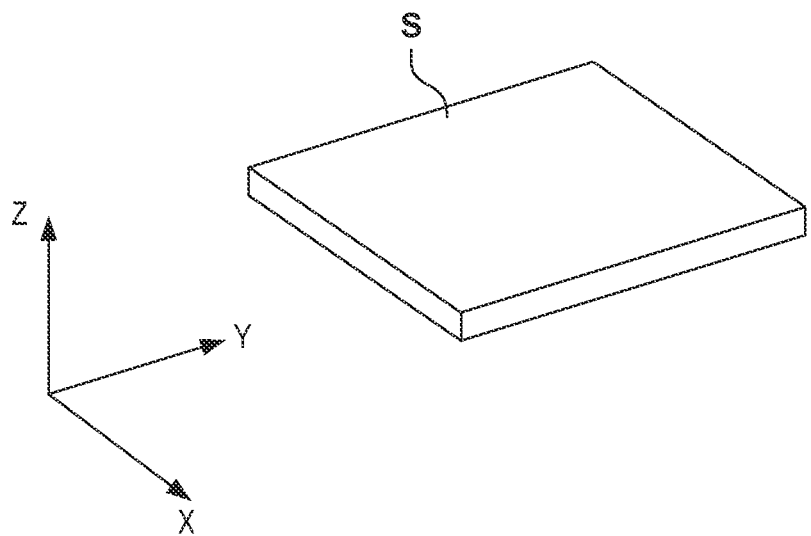
FIG. 14A is a view showing an example of a substrate.
Figure 14B:
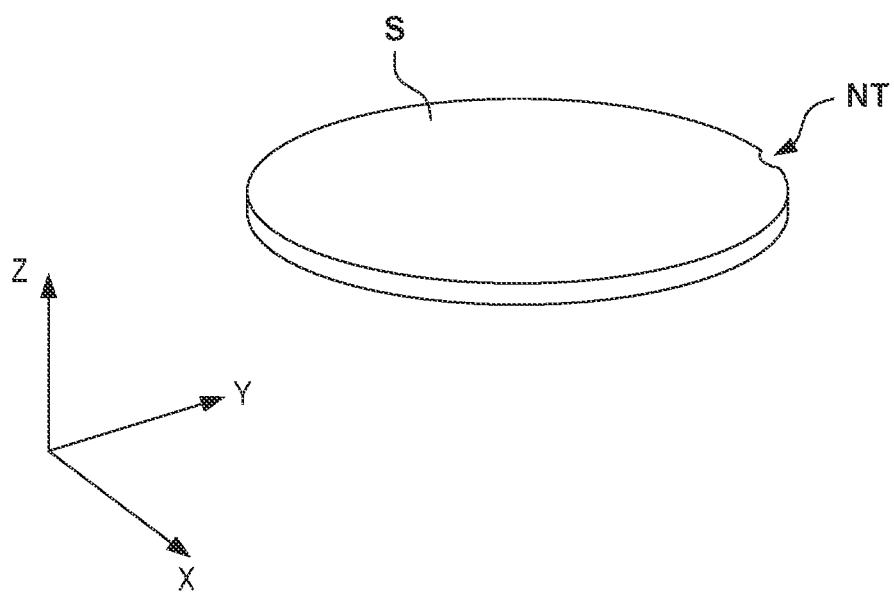
FIG. 14B is a view showing another example of the substrate.

As shown in FIG. 14A, the substrate S held by the substrate holding structure 120 can have a rectangular shape. Alternatively, as shown in FIG. 14B, the substrate S held by the substrate holding structure 120 can have a circular shape with a notch portion NT indicating a reference direction. However, the substrate S held by the substrate holding structure 120 may have another shape.

Figure 6:
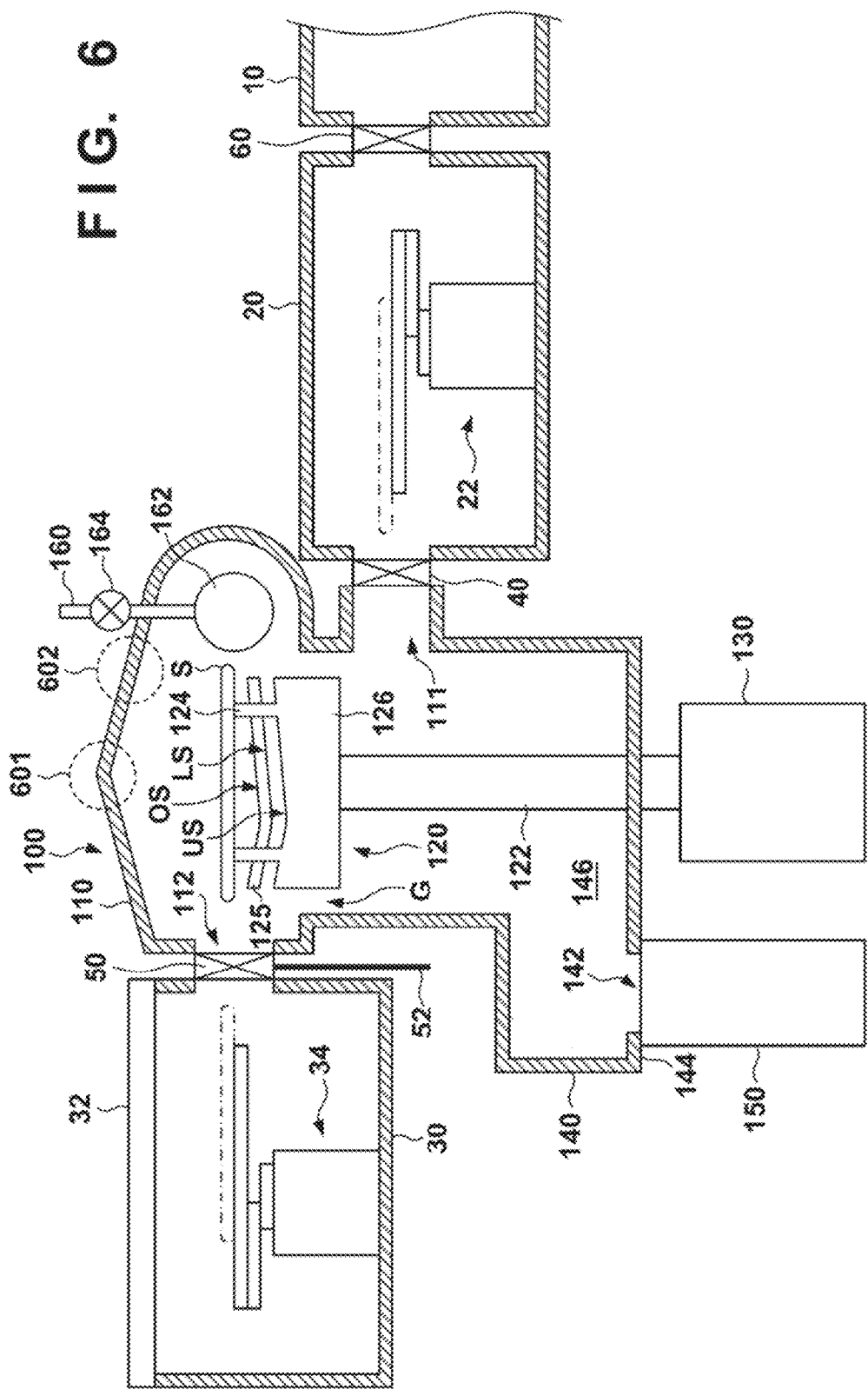
FIG. 6 is a view showing the operation of a processing device including a load lock device according to the second embodiment of the present invention.

FIG. 6 schematically shows the configuration of a processing device including a load lock device 100 according to the second embodiment of the present invention. Matters that are not mentioned as the second embodiment can comply with the first embodiment. The load lock device 100 according to the second embodiment includes a portion 601 where the ceiling portion of a load lock chamber 110 faces the inside region of the outer edge of a substrate S, and a portion 602 facing the outer edge of the substrate S, and the distance between the portion 601 and the substrate S is larger than the distance between the portion 602 and the substrate S.

Figure 7:
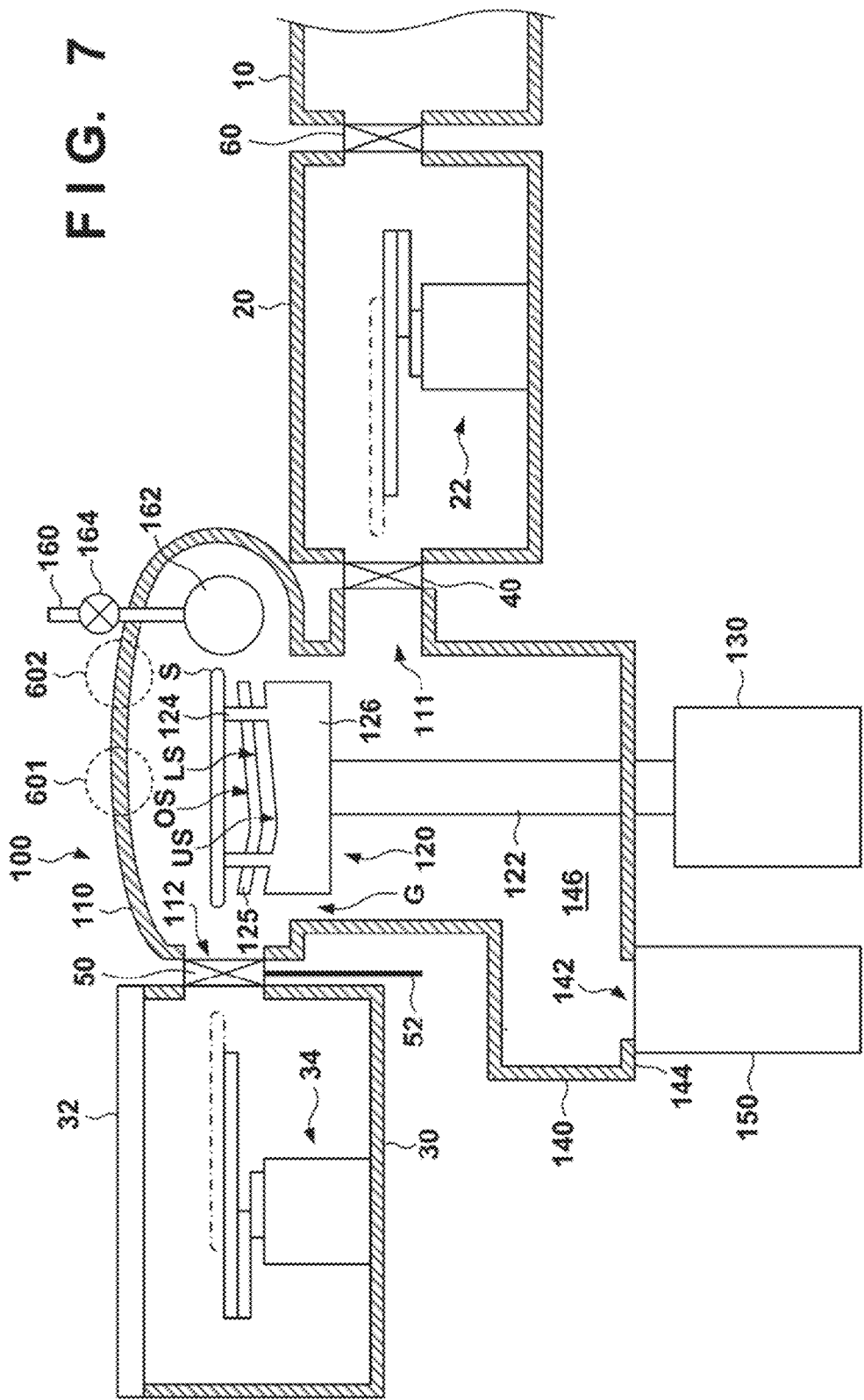
FIG. 7 is a view showing the operation of a processing device including a load lock device according to the third embodiment of the present invention.

FIG. 7 schematically shows the configuration of a processing device including a load lock device 100 according to the third embodiment of the present invention. Matters that are not mentioned as the third embodiment can comply with the first embodiment. The load lock device 100 according to the third embodiment includes a portion 601 where the ceiling portion of a load lock chamber 110 faces the inside region of the outer edge of a substrate S, and a portion 602 facing the outer edge of the substrate S, and the distance between the portion 601 and the substrate S is larger than the distance between the portion 602 and the substrate S. In the third embodiment, the portion 601 is formed by a smooth curved surface.

Figure 8:
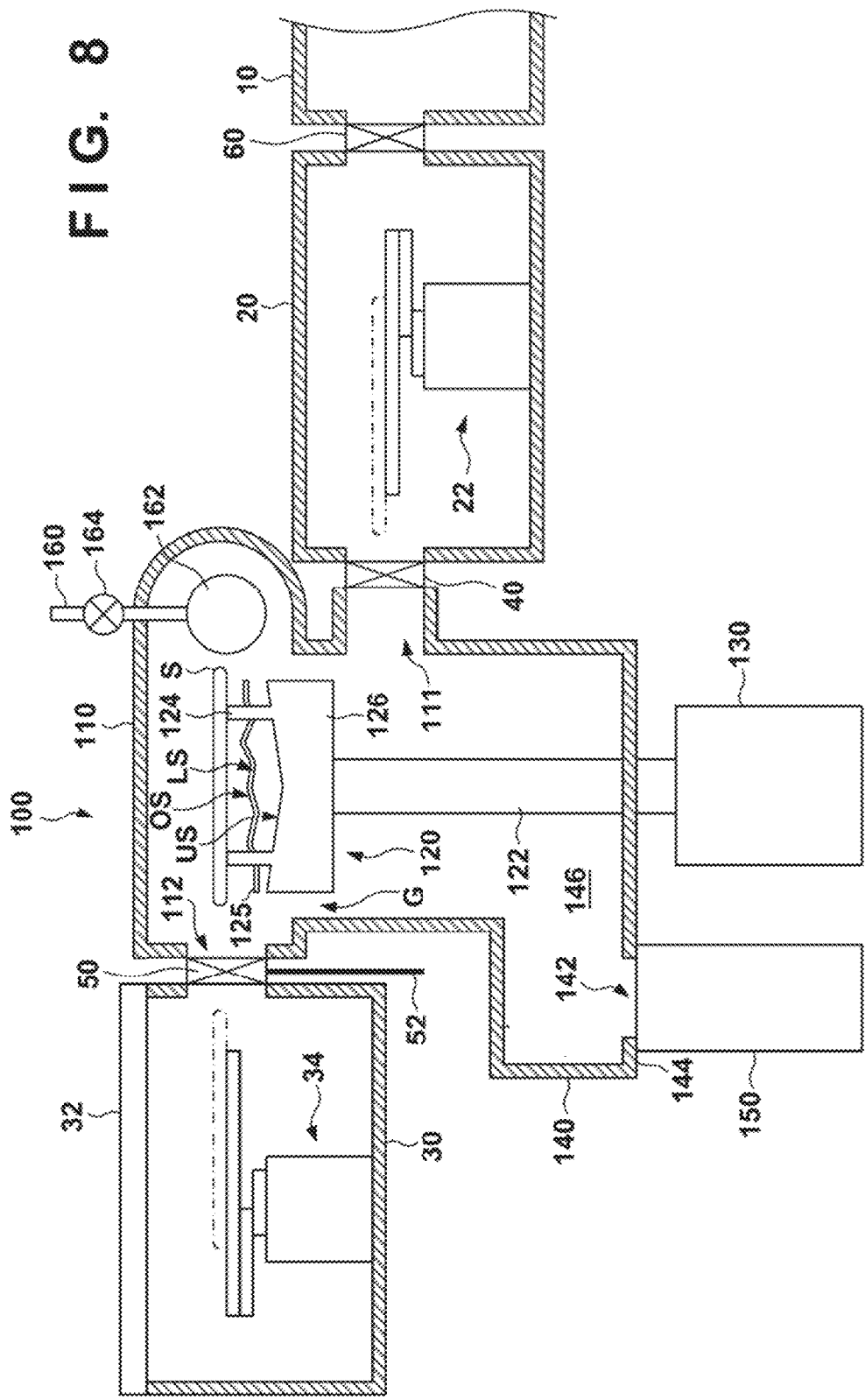
FIG. 8 is a view showing the operation of a processing device including a load lock device according to the fourth embodiment of the present invention.

FIG. 8 schematically shows the configuration of a processing device including a load lock device 100 according to the fourth embodiment of the present invention. Matters that are not mentioned as the fourth embodiment can comply with the first embodiment. In the fourth embodiment, a first member 125 has a corrugated wing shape. The corrugated wing shape is advantageous in, for example, suppressing a large vortex throughout the space between a facing surface OS and a substrate S.

Figure 9:
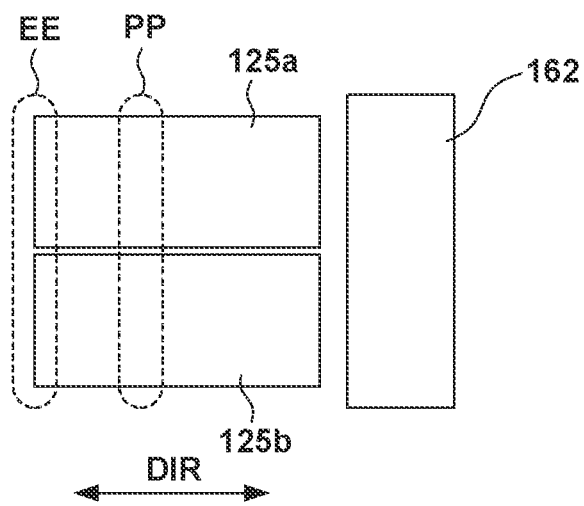
FIG. 9 is a schematic plan view of a first member in a load lock device according to the fifth embodiment of the present invention.
Figure 10:
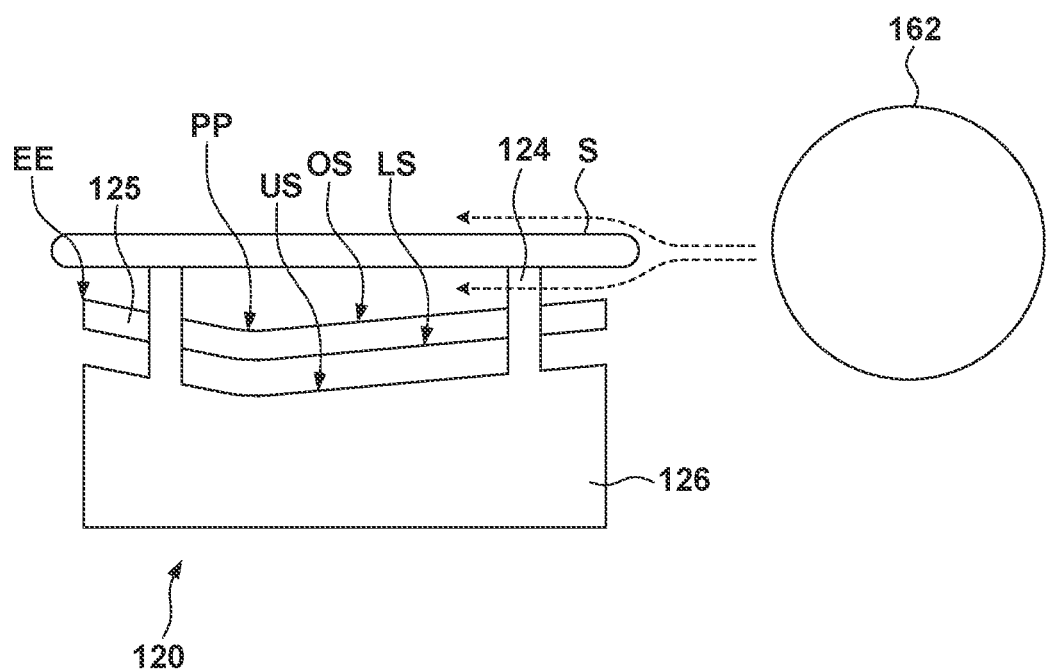
FIG. 10 is an enlarged schematic side view of a substrate holding structure in each of the load lock devices according to the first and fifth embodiments of the present invention.

FIG. 9 schematically shows a plan view of a first member 125 in a load lock device 100 according to the fifth embodiment of the present invention. FIG. 10 schematically shows a side view of the first member 125 in the load lock device 100 according to the fifth embodiment of the present invention. Matters that are not mentioned as the fifth embodiment can comply with the first embodiment. In the fifth embodiment, in a state in which a substrate S is held by a substrate holding structure 120, a portion PP located inside an outer edge EE of a facing surface OS is located inside the outer edge EE of the facing surface OS concerning a predetermined direction DIR, and the first member 125 is divided into a plurality of portions 125a and 125b concerning a direction orthogonal to the predetermined direction DIR.

The present invention is not limited to the above embodiments and various changes and modifications can be made within the spirit and scope of the present invention. Therefore, to apprise the public of the scope of the present invention, the following claims are made.

The invention claimed is:

1. A load lock device comprising:
a load lock chamber, and
a substrate holding structure configured to hold a substrate in the load lock chamber, wherein
the substrate holding structure includes a contact portion configured to contact the substrate so as to support the substrate, and a first member having a facing surface facing the substrate and arranged such that the facing surface does not contact the substrate, the substrate holding structure being configured to allow a gas to flow through a space between the substrate and the facing surface,
in a state in which the substrate is held by the substrate holding structure, a distance between the substrate and a portion located inside an outer edge of the facing surface is larger than a distance between the substrate and the outer edge of the facing surface,
the outer edge of the facing surface is defined by an outer exposed side surface of the first member.

2. The load lock device according to claim 1, wherein the substrate holding structure includes a second member with an upper surface facing a lower surface of the first member.

3. The load lock device according to claim 2, wherein the second member supports the first member and the plurality of contact portions.

4. The load lock device according to claim 3, wherein the upper surface of the second member has a shape along the lower surface of the first member.

5. The load lock device according to claim 3, wherein the first member has a corrugated wing shape.

6. The load lock device according to claim 3, wherein
the portion is located inside the outer edge of the facing surface concerning a predetermined direction, and
the first member is divided into a plurality of portions concerning a direction orthogonal to the predetermined direction.

7. The load lock device according to claim 1, wherein
the load lock chamber includes a first conveyance port connected to a transfer chamber connected to a reduced-pressure processing device, and a second conveyance port connected to a loader chamber, and
the load lock device further comprises:
a gas introducing portion arranged above a path between the substrate holding structure and the transfer chamber in a state in which the substrate is conveyed to the transfer chamber via the first conveyance port; and
a gas discharge portion arranged to discharge the gas via a space below the substrate holding structure.

8. The load lock device according to claim 7, wherein a height of the first conveyance port is lower than a height of the second conveyance port.

9. The load lock device according to claim 7, wherein
the gas introducing portion includes a gas dispersing portion configured to disperse the gas, and
the gas dispersing portion is arranged at a position facing the second conveyance port.

10. The load lock device according to claim 9, wherein
the gas dispersing portion has a pillar-shaped portion, and an inner side surface of the load lock chamber is apart from the pillar-shaped portion, and includes a curved surface along the pillar-shaped portion.

11. The load lock device according to claim 10, wherein the pillar-shaped portion has a columnar shape, and the curved surface forms a part of a cylindrical surface.

12. A load lock device comprising:
a load lock chamber, and
a substrate holding structure configured to hold a substrate in the load lock chamber, wherein
the substrate holding structure includes a facing surface facing the substrate, and is configured to allow a gas to flow through a space between the substrate and the facing surface,
in a state in which the substrate is held by the substrate holding structure, a distance between the substrate and a portion located inside an outer edge of the facing surface is larger than a distance between the substrate and the outer edge of the facing surface,
the load lock chamber includes a first conveyance port connected to a transfer chamber connected to a reduced-pressure processing device, and a second conveyance port connected to a loader chamber, and
the load lock device further comprises:
a gas introducing portion arranged above a path between the substrate holding structure and the transfer chamber in a state in which the substrate is conveyed to the transfer chamber via the first conveyance port; and
a gas discharge portion arranged to discharge the gas via a space below the substrate holding structure,
the gas introducing portion includes a gas dispersing portion configured to disperse the gas, and
the gas dispersing portion is arranged at a position facing the second conveyance port,
wherein the gas introducing portion and the gas discharge portion are controlled to execute an operation of lowering a pressure in the load lock chamber in a state in which the substrate held by the substrate holding structure is arranged at a position higher than a center axis of the gas dispersing portion, and an operation of lowering the pressure in the load lock chamber in a state in which the substrate held by the substrate holding structure is arranged at a position lower than the center axis of the gas dispersing portion.

13. The load lock device according to claim 7, further comprising a gas discharge line arranged to discharge the gas from a space near the second conveyance port.

14. The load lock device according to claim 1, wherein the substrate holding structure holds the substrate such that at least a part of a side surface of the substrate faces the inner surface of the load lock chamber.

15. The load lock device according to claim 1, further comprising a gas dispersing portion configured to disperse the gas in an internal space of the load lock chamber,
wherein the substrate holding structure holds the substrate such that at least a part of a side surface of the substrate faces an inner surface of the load lock chamber, and
a position where the substrate holding structure can be arranged includes a position where a part of the side surface of the substrate held by the substrate holding structure faces the gas dispersing portion.

16. The load lock device according to claim 1, wherein a size of the facing surface in a surface direction along a surface of the substrate is smaller than a size of the substrate in the surface direction.

17. The load lock device according to claim 1, wherein
the portion is located inside the outer edge of the facing surface concerning a predetermined direction in a horizontal plane, and
cross sections of the facing surface cut along at least three planes that are apart from each other and perpendicular to the horizontal plane and parallel to the predetermined direction have shapes identical to each other.

18. The load lock device according to claim 1, wherein the substrate held by the substrate holding structure has a rectangular shape.

19. The load lock device according to claim 1, wherein the substrate held by the substrate holding structure has a circular shape with a notch portion indicating a reference direction.

20. The load lock device according to claim 1, wherein the facing surface does not contact a peripheral portion of the substrate.

21. A load lock device comprising:
a load lock chamber, and
a substrate holding structure configured to hold a substrate in the load lock chamber, wherein
the substrate holding structure includes a facing surface facing the substrate, and is configured to allow a gas to flow through a space between the substrate and the facing surface,
in a state in which the substrate is held by the substrate holding structure, a distance between the substrate and a portion located inside an outer edge of the facing surface is larger than a distance between the substrate and the outer edge of the facing surface,
the portion is located inside the outer edge of the facing surface concerning a predetermined direction in a horizontal plane, and
cross sections of the facing surface cut along at least three planes that are apart from each other and perpendicular to the horizontal plane and parallel to the predetermined direction have shapes identical to each other.

* * * * *